United States Patent [19]

Kamiyama et al.

[11] Patent Number: 5,323,405
[45] Date of Patent: Jun. 21, 1994

[54] ANTI-GUIDED PHASE-LOCKED ARRAY AND MANUFACTURING METHOD THEREFOR

[75] Inventors: Satoshi Kamiyama; Kiyoshi Ohnaka, both of Osaka, Japan

[73] Assignee: Matsushita Electric Industrial Co., Ltd., Osaka, Japan

[21] Appl. No.: 953,359

[22] Filed: Sep. 30, 1992

[30] Foreign Application Priority Data

Oct. 2, 1991 [JP] Japan .................... 3-255168

[51] Int. Cl.⁵ ............... H01S 3/082; H01S 3/25; H01S 3/098
[52] U.S. Cl. ........................ 372/18; 372/45; 372/46; 372/50
[58] Field of Search ............... 372/50, 46, 43, 18, 372/45

[56] References Cited

U.S. PATENT DOCUMENTS

| | | | |
|---|---|---|---|
| 4,860,298 | 8/1989 | Botez et al. | 372/46 |
| 4,866,724 | 10/1989 | Botez et al. | 372/46 |

FOREIGN PATENT DOCUMENTS

| | | | |
|---|---|---|---|
| 212886 | 1/1990 | Japan . | |
| 2237089 | 9/1990 | Japan . | |
| 0133189 | 6/1991 | Japan | 372/45 |

OTHER PUBLICATIONS

Botez et al., IEEE Cir & Dev., vol. 2, Jan. 1986 "Phase-Locked Arrays of Semiconductor Diode Lasers" pp. 8-15.

"Phase-Locked Arrays of Antiguides: Modal Content and Discrimination"; by Botez et al; IEEE Journal of Quantum Electronics. vol. 26. No. 3, Mar. 1990; pp. 482-495.

"High-Power, In-Phase-Mode Operation From Resonant Phase-Locked Arrays of Antiguided Diode Lasers" by Mawst et al., Appl. Phys. Lett. 55(1), Jul. 3, 1989; pp., 10-12.

Primary Examiner—Rodney B. Bovernick
Assistant Examiner—Robert McNutt
Attorney, Agent, or Firm—Lowe, Price, LeBlanc & Becker

[57] ABSTRACT

A phase-locked laser array comprising a plurality of element regions for passing electric current into an active layer; and inter-element regions formed between the element regions. Each of the inter-element regions is so formed as to have two regions, i.e. a non-diffusion region at the center thereof and a diffusion regions disposed on both sides thereof, thereby rendering the refractive index in the non-diffusion region higher than that in the diffusion regions. The method of manufacturing the phase-locked laser array which is characterized by including a step growing an optical waveguide layer of superlattice on a portion of a second clad layer while diffusing impurities doped in the second clad layer into said optical waveguide layer, thereby forming a diffusion regions on both sides of the inter-element region.

18 Claims, 9 Drawing Sheets

ANTI-GUIDED PHASE-LOCKED ARRAY AND MANUFACTURING METHOD THEREFOR

BACKGROUND OF THE INVENTION

1. Field of the Invention

This invention relates to a light visible phase-locked array, which can be utilized in an optical measurement, an information processing and the like, and a method of manufacturing the same.

2. Description of the Prior At

Recently, there is an increasing demand for a semiconductor laser in various fields of industry. To meet these demands, the semiconductor lasers made mainly from GaAs based semiconductor or InP based semiconductor have been actively commercialized. In particular, the demand for a semiconductor laser of high output is so persistent that, in the case of a GaAs based semiconductor laser, a product having a light output exceeding 50 mW has been developed.

However, a material for the semiconductor laser has a limitation with respect to the degree of the light density which can be allowed to emit from the out-going side of the material. Since the laser may be destroyed as the light density exceeds this limitation, the maximum light output of the semiconductor element is determined depending upon the size of the sectional area of light beam at the out-going end face of the material. Thus, in the case of a stable fundamental transverse-mode laser, since its transverse-mode thereof is stabilized by confining light in a light waveguide channel of a small sectional area, the laser is structurally unsuited for enhancing the output thereof, and its output is limited to the order of 100 mW.

Therefore, in order to obtain a stable transverse mode as well as high out-put, a structure of so-called a phase-locked array has been developed. With this semiconductor laser, a stable transverse mode is realized by employing a plurality of adjacent waveguide channels and combining light phases in each of the waveguide channels. Moreover, since the output of the phase-locked array can be given by the sum of the outputs derived from each of the waveguide channels, it is possible to increase the light output by increasing the number of the waveguide channels 1

FIGS. 5a to 5c illustrate the classification of the phase-locked arrays, which are classified according t6 the guiding mechanism. As in the case of the single guiding channel employed in the ordinary semiconductor laser, a gain guided type (FIG. 5a), a loss guided type (FIG. 5b) and an index guided type (FIG. 5c) are mainly employed. In these Figures, reference numeral 10 denotes GaAs substrate, 11 a first clad layer, 12 an active layer, 13 a second clad layer, 15 p-type $Al_{0.18}Ga_{0.82}As$ layer, 17 a cap layer, 18 a blocking layer, 19 an element region and 20 an inter-element region.

In the gain guided type laser (FIG. 5a), the refractive index in a region having a gain is smaller than that in a region having no gain (non-gain region) as shown in FIG. 6a, whereas in both of the loss guided type laser (FIG. 5b) and the index guided type laser (FIG. 5c), the refractive index in a region having a gain is larger than that in a region having no gain (non-gain region) as shown in FIGS. 6b and 6c.

Additionally, there is also an anti-guided type hereinafter explained with reference to FIGS. 9 and 10. This anti-guided type is featured as shown in FIG. 6d in that the refractive index in a region having a gain is smaller than that in a region having no gain, which is quite different from the refractive index distributions the loss guided type laser (FIG. 5b) and of the index guided type laser (FIG. 5c).

In GaAs-based semiconductors, the gain guided type (FIG. 5a) and the loss guided type (FIG. 5b) have been widely utilized. Likewise, in the phase-locked arrays, lasers of these types are widely utilized, because the same manufacturing process as that of the GaAs-based semiconductors can also be utilized in the phase-locked array. A laser of the index guided type is also widely utilized as it can be manufactured by forming a simple ridge stripe structure.

As for the coupling of waveguide channels in the phase-locked arrays, there are two coupling modes; namely, 0° phase coupled mode wherein the phase of a waveguide channel coincides with the phase of the neighboring waveguide channel, and 180° phase coupled mode wherein the phase of a waveguide channel is shifted from the neighboring waveguide channel by 180°. In the case of the 0° phase coupled mode, it is possible to obtain a single lobe far field pattern as shown in FIG. 7a, so that it is easy to obtain a parallel light beam or to condense the light beam. Whereas in the case of the 180° phase coupled mode, a twin lobe far field pattern will be resulted as shown in FIG. 7b, so that it is rather difficult to utilize the mode.

In the structure of the loss guided type laser (FIG. 5b) or the index guided type laser (FIG. 5c), the refractive index $n_1$ in the element region is higher than the refractive index $n_0$ in the inter-element region as described above. Accordingly, when the structure of the loss guided type or the index guided type laser is employed, light beam thereof is fundamentally forced to be confined within the element region, so that the coupled mode thereof may most likely be of the 180° phase coupled mode as shown in FIG. 8a.

The reason of the tendency of the structure of the loss guided type or the index guided type to take 180° phase coupled mode can be attributed to the fact that since the intensity of light in the inter-element region is low]the light intensity at the center of the inter-element region is approximately zero, so that the 180° phase coupled mode is much favored in view of less degree of the waveguide loss and a higher stability of light.

In the structure of the gain guided type laser (FIG. 5a), the refractive index distribution thereof indicates that the refractive index in the element region is slightly less than that in the inter-element region as shown in FIG. 6a. Therefore, light is weakly confined in the element region, thus the 0° phase coupled mode is more favored to occur. However, since this structure of the gain guided type laser is designed to obtain the light solely through a gain, this phase coupled mode is rather unstable against temperature and optical output.

On the other hand, in the anti-guided type laser, the refractive index distribution thereof indicates as shown in FIG. 6d that the refractive index in the element region is lower than that in the inter-element region as the case of the gain guided type. However, this anti-guided type laser is more advantageous than the gain guided type laser in that a very strong coupling of light can be obtained between the neighboring element regions due to a large difference in defractive index between the element region and inter-element region, so that the 0° phase coupled mode can be more easily obtained as shown FIG. 8b.

To be more specific, there is a gain in the element region so that light is confined in the element region, while in the inter-element region, the refractive index therein is higher than that in the element region that light is confined also in the inter-element region. As a result, the coupling of light occurs in the element region as well as in the inter-element region, thereby allowing the 0° phase coupled mode to be easily obtained.

In the followings, the anti-guided type will be discussed more in detail. FIG. 9 schematically shows a perspective view of the elemental structure of the conventional anti-guided type phase-locked array, and FIG. 10 shows an enlarged sectional view of the main part of the phase-locked arrays shown in FIG. 9 (Appl. Phys. Lett. 55 (1), July 1989).

As shown in FIGS. 9 and 10, on a GaAs substrate are formed in succession a first clad layer 11 of n-type $Al_{0.4}Ga_{0.6}As$, an active layer 12 constituting a GaAs/AlGaAs multiple quantum well layer, and a second clad layer 13 of p-type $Al_{0.4}Ga_{0.6}As$. The second clad layer 13 is etched into a mesa structure thereby forming an element region 13a through which electric current is to be passed into the active layer 12, and an inter-element region 13b through which electric current is not to be passed into the active layer 12. In this case, the refractive index $n_1$ in the inter-element region is higher than the refractive index $n_0$ in the element region.

On the mesas-shaped second clad layer 13 is selectively formed a p-GaAs layer 14. Further on all surface of the second clad layer 13 including the p-GaAs layer 14 is formed a p-$Al_{0.18}Ga_{0.82}$ As layer 15, on which a p-$Al_{0.4}Ga_{0.6}$ As layer 16 is further formed. Reference numeral 17 represents a cap layer formed on the p-$Al_{0.4}Ga_{0.6}$ As layer 16.

In this device, AlGaAs layer 16 is formed over the element region 13a and the inter-element region 13b. In particular, in the inter-element region, this AlGaAs layer 16 is formed close to the active layer 12. Whereas in the element region, this AlGaAs layer 16 is formed remote from the active layer 12. Therefore, the refractive index in the inter-element region is higher than that in the element region as shown in FIG. 10. Moreover, since there is a large difference in defractive index between the element region and inter-element region, it is possible to attain a highly stabilized mode coupling.

Electric current is selectively caused to flow into the element region. In this occasion, oscillations are caused to occur not in the inter-element region due t6 the large radiation loss therein of the optical mode, but only in the element region. In order to maximize the coupling between the neighboring element regions in this construction, the width "s" of the inter-element region is set to approximately a half of the resonance wavelength lateral wavelength of light as follows (IEEE J. Quantum Electron 26,482, 1990):

$$s = \lambda_1/2$$

$$\lambda_1 = \lambda/(n_1^2 - n_0^2 + (\lambda/2d)^2)^{\frac{1}{2}}$$

wherein s is a guide region spacing; d is stripe width; $\lambda$ is wavelength; $\lambda_1$ is lateral wavelength; $n_0$ is an effective refractive index in the element region; and $n_1$ is an effective refractive index in the inter-element region.

When the width "s" of the inter-element region is set in this manner, the array mode turns into a resonance state, so that all of the elements couple to each other the 0° phase coupled mode, and take a state of the highest array mode gain (i. e. a state wherein the oscillation of the 0° phase coupled mode is most likely to occur).

However, even with this conventional anti-guided type phase-locked arrays, it is difficult to achieve a stable 0° phase coupled mode. The reasons for this can be explained as follows.

FIG. 11 illustrates the gain of each of the modes in relative to the width "s" of the inter-element region the number of the element is set to 10.

As seen from FIG. 11, when $s = \lambda_1/2$, the gain for the 0° phase coupled mode is in a high level as indicated by the solid line. However, in addition to the 0° phase coupled mode, there are also a 180° phase coupled mode and an adjacent mode as indicated by broken lines. In this case, since it is difficult to enlarge the gain difference $g_p$ between the gain of the 0° phase coupled mode and the gain of either the 180° phase coupled mode or the adjacent mode, the shifting of mode, i. e. from the 0° phase coupled mode to the 180° phase coupled mode or to the adjacent mode may be frequently caused to occur.

In other words, the elements of the phase-locked array may be producing a laser of various modes in a disordered manner, or the mode (zero-order mode or first-order mode) to be selected by each element may be fluctuated depending on a light output, or becomes highly unstable as shown in FIGS. 12a to 12d.

Therefore, in order to obtain only the 0° phase coupled mode, it has been required to take some measures, such for example as to mount a Talbot filter (Appl. Phys. Lett. 5(1), Jul. 3, 1989) in separate to the phase locked laser arrays.

SUMMARY OF THE INVENTION

One of the object of the present invention is to provide a structure of phase-locked array wherein the radiation loss of the 180° phase coupled mode or the adjacent mode can be promoted, thus making it possible to obtain a stable 0° phase coupled mode.

Another object of the present invention is to provide a method of forming a desired refractive index distribution in an inter-element region as an effective means for obtaining a stable 0° phase coupled mode.

The former object has been attained according to the present invention by providing a phase-locked laser array, which comprises a compound semiconductor substrate; a first clad layer; an active layer; a second clad layer; a plurality of element regions for allowing electric current to flow into said active layer; and inter-element regions formed between said element regions and adapted not to allow electric current to flow therethrough; said inter-element regions comprising a non-diffusion region located at the center portion thereof and a diffusion regions disposed on both sides of said center portion; and a refractive index in said non-diffusion region being higher than that in said diffusion regions.

The latter object has been attained according to the present invention by providing a method of manufacturing a phase-locked laser array, which comprises the steps of: forming in sequence a first clad layer, an active layer and a second clad layer having a prescribed carrier concentration on a compound semiconductor substrate; etching said second clad layer thereby forming ridge stripes, each having side surfaces constituting (111)A, crystal planes; and selectively growing an optical waveguide layer of superlattice on a portion of the second clad layer between said ridge stripes, while diffusing impurities doped in said second clad layer into said optical waveguide layer.

According to the present invention, since the refractive index at the center portion of the inter-element region is set to be higher than the refractive index at the periphery portions thereof, the radiation loss of the 180° phase coupled mode or the adjacent mode can be promoted, thereby making it possible to obtain a stable 0° phase coupled mode.

According to the method of the present invention, it is possible to cause the superlattice of the optical waveguide layer to be turned into a disordered state by self-diffusing impurities from the side surfaces constituting (111)A crystal planes of the ridge stripe during the growths of the optical waveguide layer and a third clad layer. As a result, it is possible to form an inter-element region wherein the refractive index thereof is higher at the central portion thereof, and lower at the both peripheral side portions thereof.

BRIEF DESCRIPTION OF THE DRAWING

FIG. 12b to FIG. 12d respectively shows an electric field intensity pattern of 0° phase coupling or 180° phase coupling in relative to the refractive index pattern shown in FIG. 12a.

DESCRIPTION OF THE PREFERRED EMBODIMENT OF THE INVENTION

Embodiments of this invention will be further explained with reference to the drawings.

Figure 1:
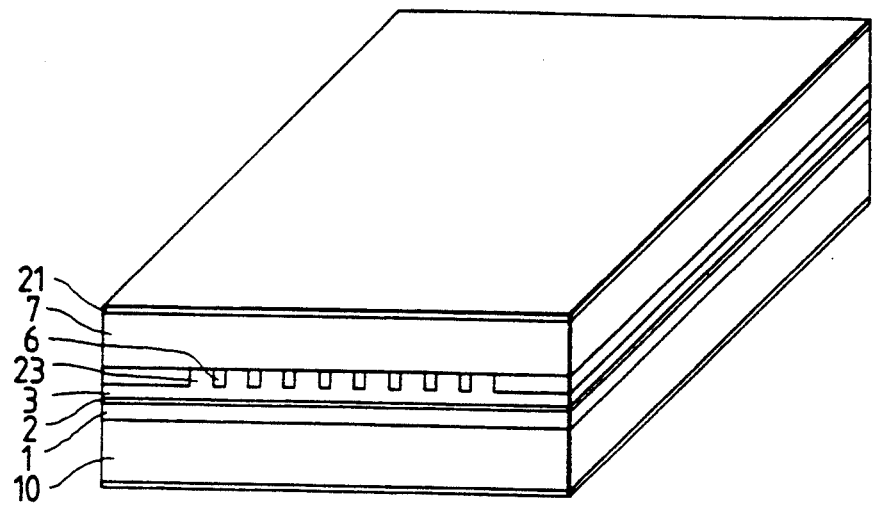
FIG. 1 is a perspective view of a phase-locked laser array of this invention.
Figure 2:
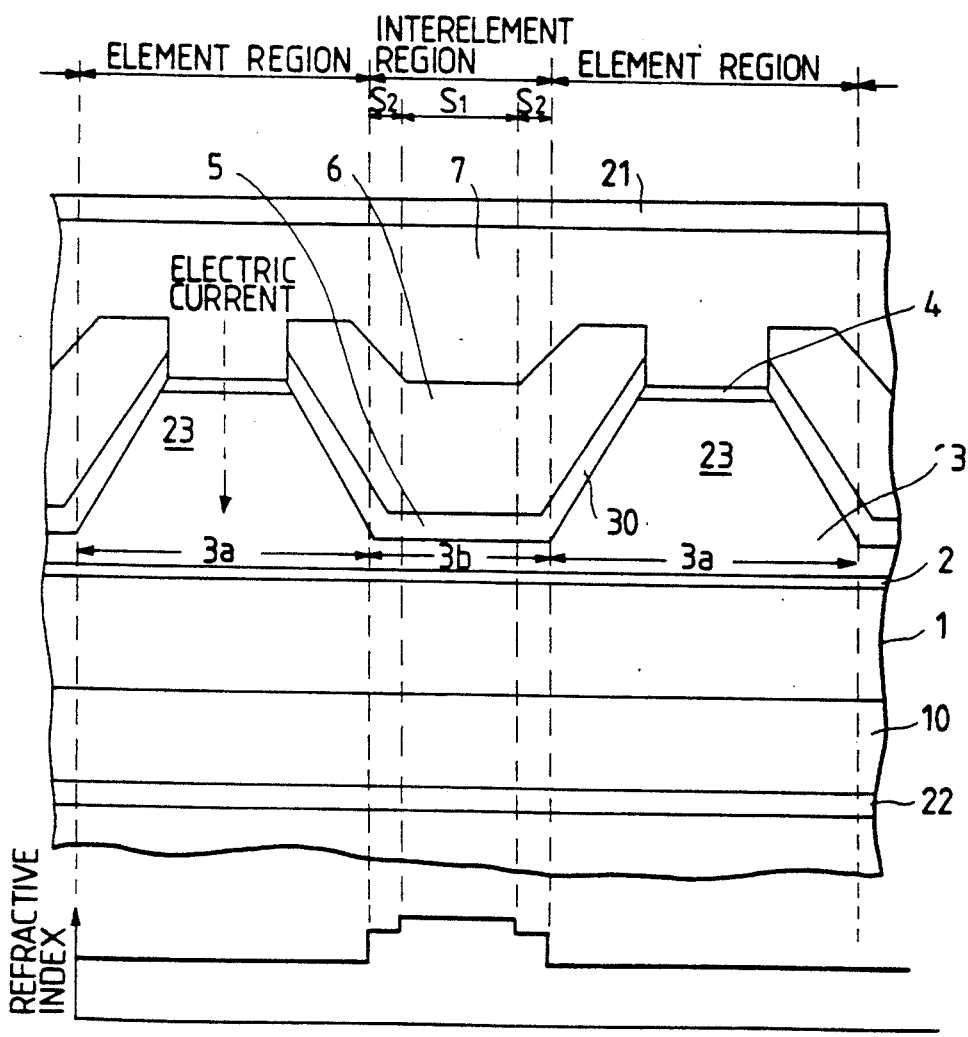
FIG. 2 is an enlarged sectional view of a phase-locked laser array of this invention, whose refractive index is also shown at the bottom portion thereof.

FIG. 1 schematically depicts a perspective view of a phase-locked laser array of this invention, and FIG. 2 depicts an enlarged sectional view of the phase-locked laser array shown in FIG. 1.

As shown in these FIGS. 1 and 2, the phase-locked laser array of this invention comprises an n-type GaAs substrate 10, on which a first clad layer 1 of n-type AlGaInP; an active layer 2; a second clad layer 3 of p-type AlGaInP are deposited in sequence. The second clad layer 3 is then etched to form two regions, i. e. a plurality of the element regions 3a, each forming a ridge stripe 23 of mesa-shape, and a plurality of the inter-element regions 3b, each being formed into a concave shape into which an optical waveguide layer 5 of superlattice and a third clad layer 6 of an n-type AlGaInP are filled. Further, a cap layer 7 is formed so as to overlay the second clad layer 3 and the third clad layer 6. On this cap layer 7 is further formed an anode electrode 21. A cathode electrode 22 is formed on the bottom surface of the substrate 10.

One of the most important aspects of this invention resides in that the optical waveguide layer 5 of superlattice is formed on the side surfaces of the ridge stripe 23 of the element region 3a as well as on the surface of the inter-element regions 3b. The optical waveguide layer 5 formed on the side surfaces of the ridge stripe 23 are so disposed as to be gradually kept away from the active layer 2, so that the effective refractive index of the optical waveguide layer 5 is kept lower than the effective refractive index of the diffusion region of the inter-element regions 3b.

Figure 8A:
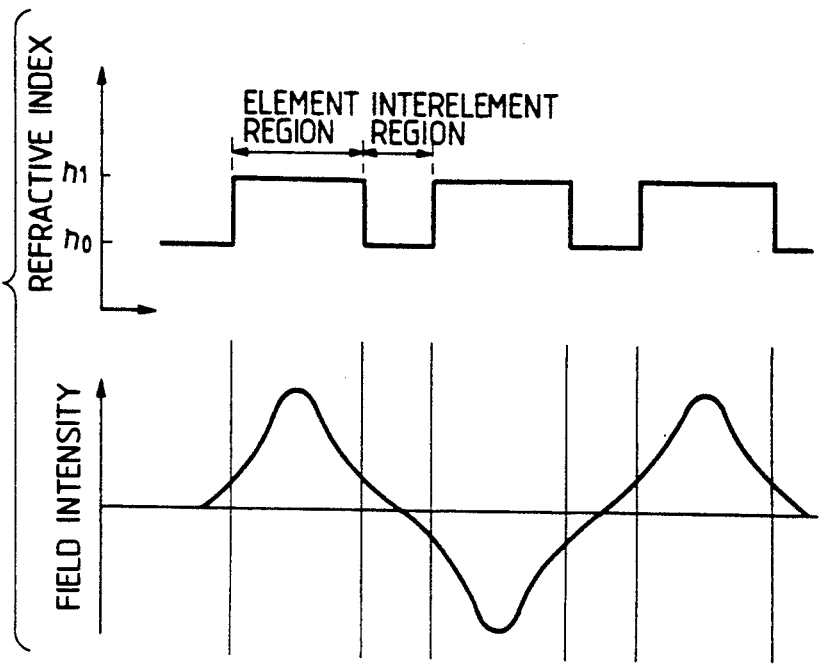
FIG. 8a and FIG. 8b respectively shows a relationship between a refractive index distribution pattern and a field intensity pattern.
Figure 8B:
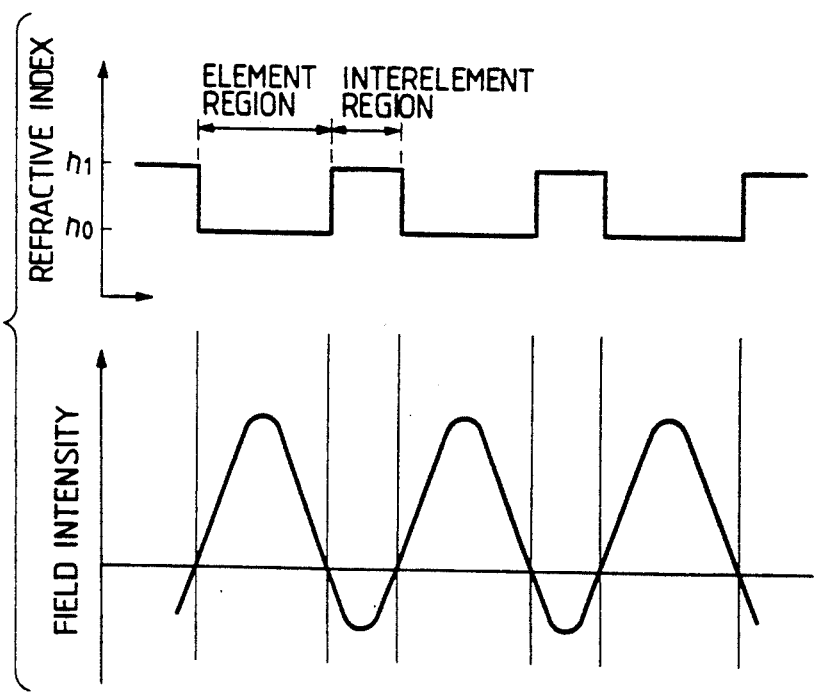
Figure 9:
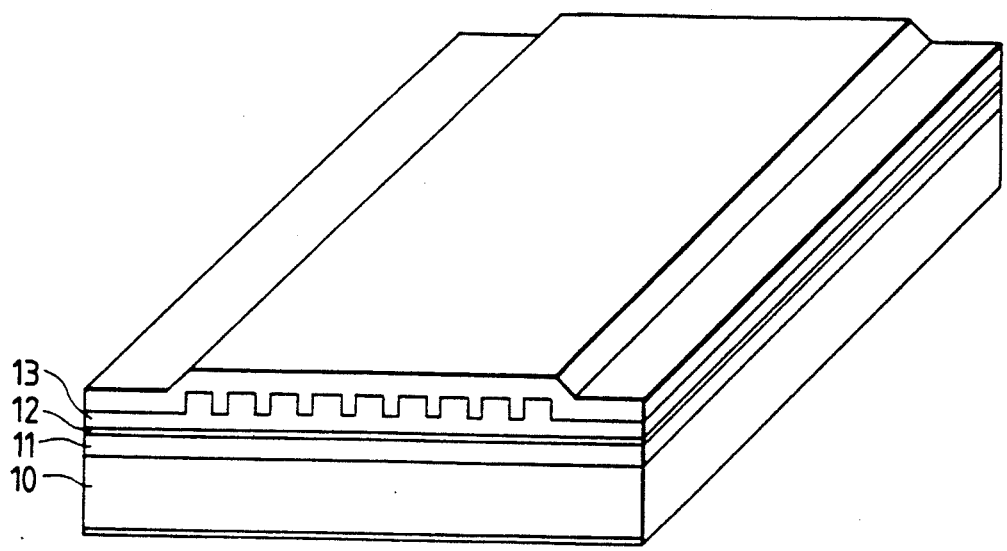
FIG. 9 is a perspective view of a conventional phase-locked laser array.
Figure 11:
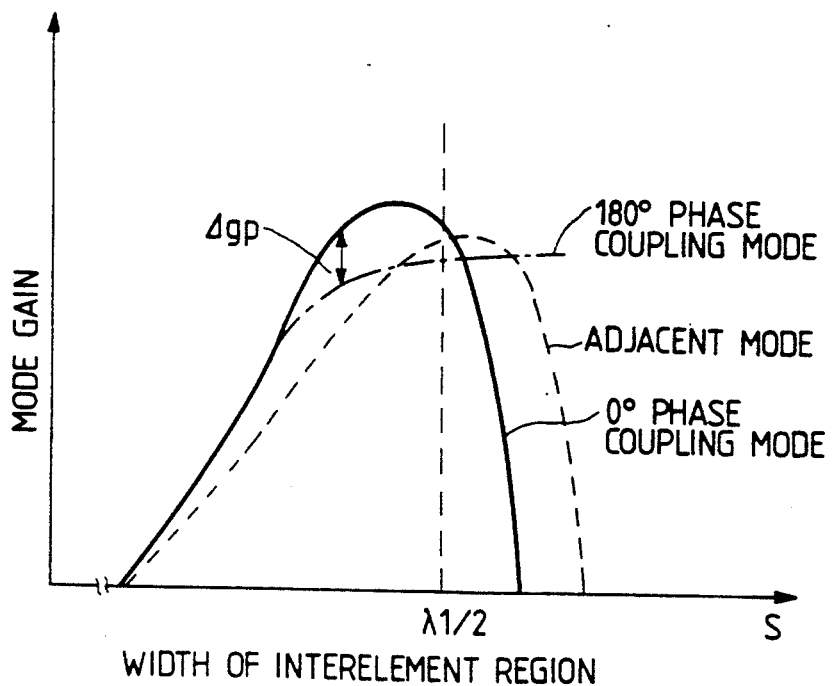
FIG. 11 is a diagram explaining the relationship between the width of inter-element region and the mode gain.
Figure 10:
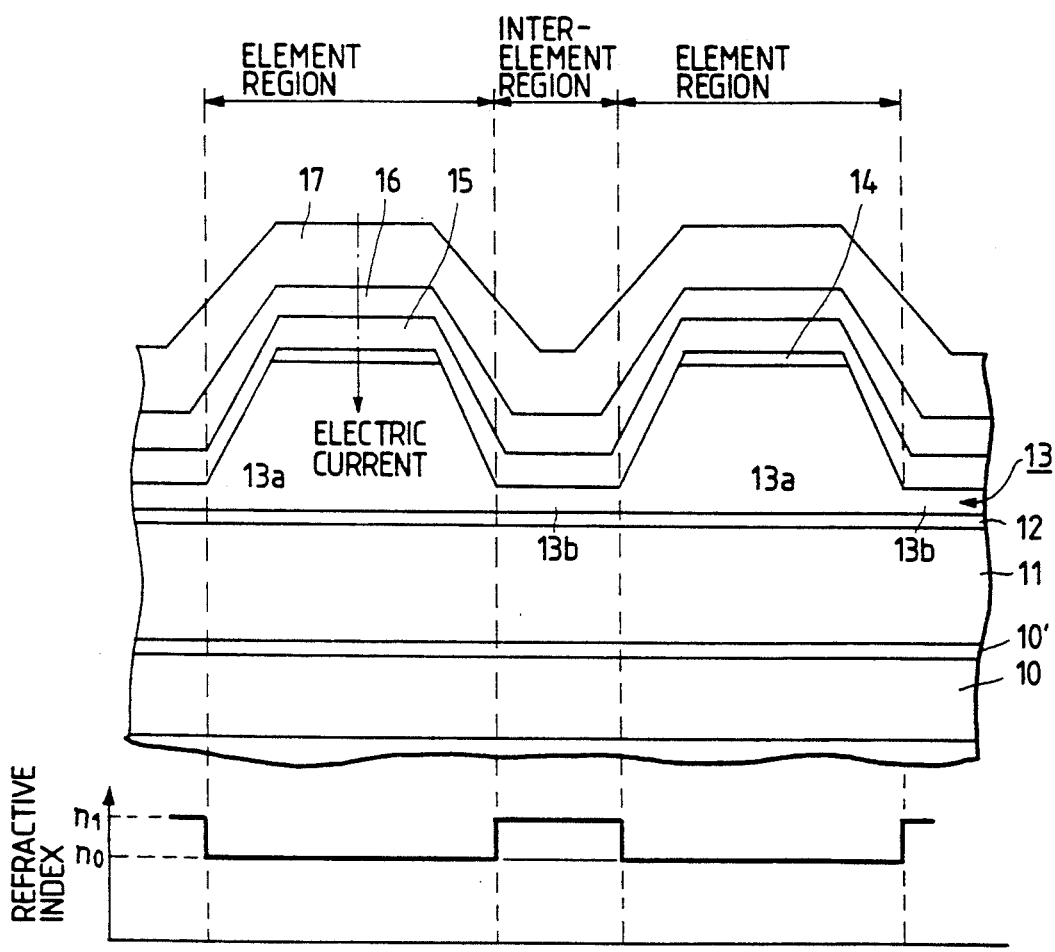
FIG. 10 is an enlarged sectional view of a conventional phase-locked laser array, whose refractive index is also shown at the bottom portion thereof.
Figure 12A:
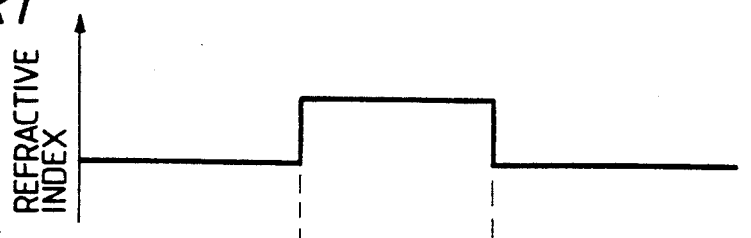
FIG. 12a represents a refractive index distribution pattern.
Figure 12B:
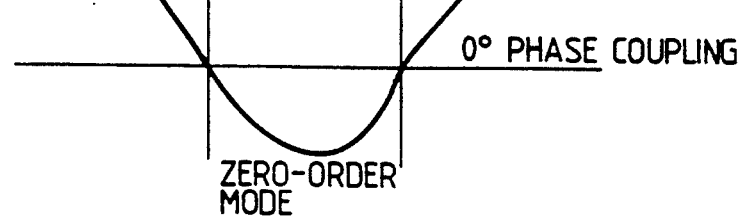
Figure 12C:
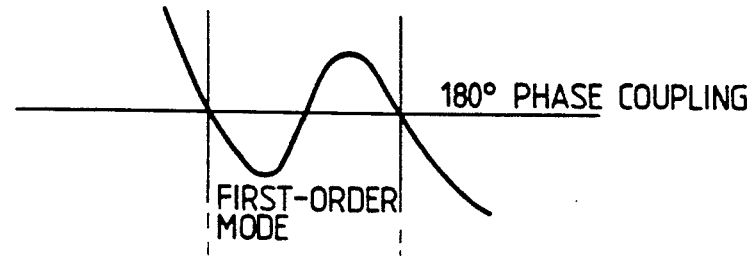
Figure 12D:
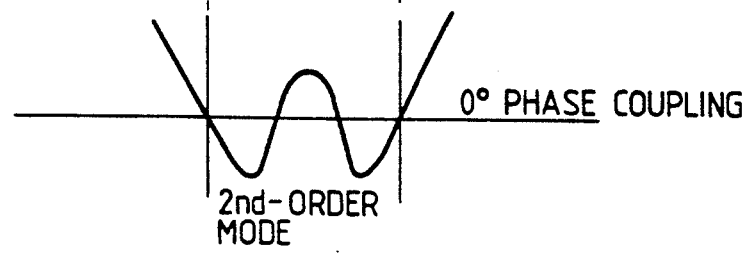

Further, both sides of the optical waveguide layer 5 in the inter-element regions 3b are separated into a diffusion region $S_2$ where impurities are diffused, and a non-diffusion region $S_1$ where impurities are not diffused. In this diffusion region $S_2$, superlattice thereof is turned into a disordered state due to the diffusion of the impurities, so that the refractive index in this region is made substantially lower than that in the non-diffusion region $S_1$. As a result, the respective refractive index in the element region 3a, the diffusion region $S_2$ and the non-diffusion region $S_1$ differs from each other as shown at the bottom portion of FIG. 2. Especially in the inter-element regions 3b, the refractive index thereof is made higher at the portion constituting the non-diffusion region $S_1$, so that light is more liable to be confined in this non-diffusion region $S_1$. By making use of this phenomenon, it is possible to stably obtain the 0 phase coupled mode as shown in FIG. 8b.

Next, the method of manufacturing the phase-locked laser array shown in FIGS. 1 and 2 will be explained with reference to FIG. 3.

Figure 3A:
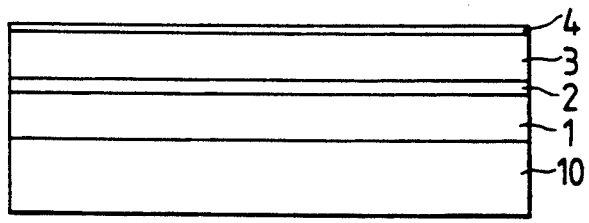
FIG. 3a to FIG. 3e are sectional views explaining in processwise a manufacturing step of a phase-locked laser array of this invention.
Figure 3B:
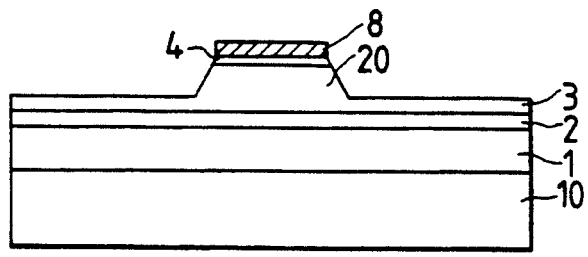

As shown in FIG. 3a, a first clad layer 1 of n-type $(Al_{0.7}Ga_{0.3})InP$ 1 μm in thickness, an active layer 2 0.06 μm in thickness, a second clad layer 3 of p-type $(Al_{1-7}Ga_{0.3})InP$ 1 μm in thickness and an oxidation-resistant layer 4 of p-type GaInP 0.1 μm in thickness were grown in sequence on an n-type GaAs substrate 10 as a first growth step by employing a low-pressure metal organic chemical vapor deposition method, Then, as shown in FIG. 3b, a stripe-like etching mask pattern 8 consisting of $SiO_2$ was formed on the resultant crystal surface of the oxidation-resistant layer 4, and subsequently an etching treatment was performed by using a sulfuric acid type etchant. This etching treatment was terminated after the etching was proceeded down to a depth which was about 0.2 μm above the active layer 2, thereby completing the formation of a pattern of the ridge stripe 23 having a stripe width of 3 μm and an interval of 5 μm.

Figure 3C:
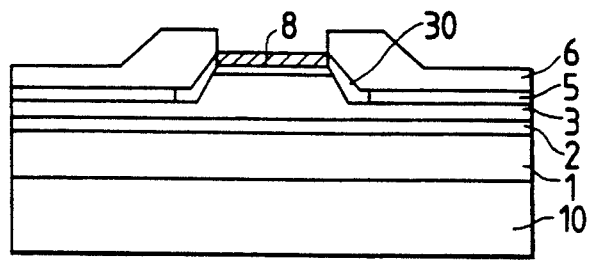

Further, while leaving the stripe mask pattern 8 as it is as shown in FIG. 3c, a superlattice waveguide layer 5 consisting of a plurality of 6 nm thick GaInP well layers, each well layer being partitioned by a 10 nm thick $(Al_{0.5}Ga_{0.5})InP$ barrier layer, and a third clad layer 6 of an n-type AlGaInP were sequencially grown on the second clad layer 3 at a temperature of 700° C. or more by employing the low-pressure metal organic chemical vapor deposition method as a second growth step. The number of the well layers in the superlattice waveguide layer 5 was 10.

In this case, since the second clad layer 3 of p-type ($Al_{0.7}Ga_{0.3}$) InP was doped in advance with Zn at carrier concentration of $1 \times 10^{13}$ cm$^{-3}$, when the superlattice waveguide layer 5 and a third clad layer 6 of an n-type AlGaInP were grown at a temperature of for example 750° C., by means of the second low-pressure metal organic chemical vapor deposition method as mentioned above, the dopant Zn in the second clad layer 3 was vigorously diffused only from the (111)A crystal plane of the side surface of the ridge stripe 23 into the superlattice waveguide layer 5. As a result, only a portion of the superlattice waveguide layer 5 which is located adjacent to the ridge stripe 23 was turned into a disordered state, thereby forming a alloy region 30 having a composition of ($Al_{0.2}Ga_{0.8}$)InP or the like. However, the remainder of the superlattice waveguide layer 5 was remained unchanged keeping its original state.

Figure 3D:
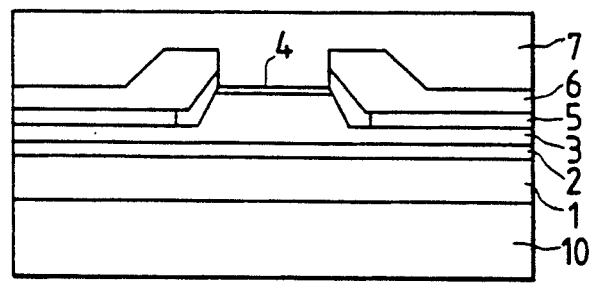

After removing the stripe mask pattern 8 as shown in FIG. 3d, a p-GaAs cap layer 7 was grown as a third growth step by using the low-pressure metal organic chemical vapor deposition method.

Figure 3E:
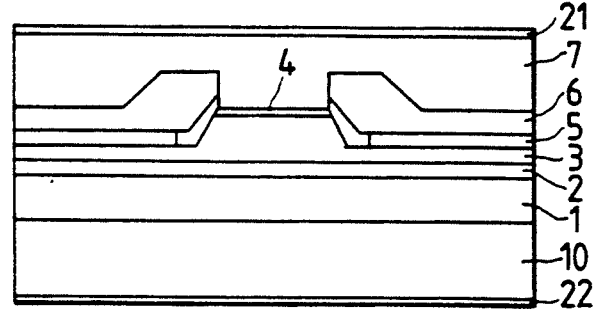

Finally, as shown in FIG. 3e, an anode electrode 21 and a cathode electrode 22 were respectively formed on the top and the bottom of the device thereby completing a laser array element.

In the phase-locked laser array of this invention, the width $S_1$ of the non-diffusion region of the inter-element region and the width $S_2$ of the diffusion region satisfy the following conditions:

$$S_1 + 2S_2 = \lambda_1/2$$

$$\lambda_1 = \lambda/(n_0^2 + (\lambda/2d)^2)^{\frac{1}{2}}$$

wherein $S_1$ is the width of the non-diffusion region; $S_2$ is the width of the diffusion region; d is the width of the inter-element region; $\lambda$ is wavelength; $\lambda_1$ is lateral wavelength; $n_0$ is an effective refractive index in the element region; and $n_1$ is an effective refractive index in the inter-element region.

In this embodiment, the refractive index of $n_1$ was 3.4396, the refractive index of $n_0$ was 3.4292, wavelength was 680 nm, the width of the element regions was set to 3 $\mu$m, and the total of the widths $S_1$ and $S_2(\times 2)$ of the non-diffusion region and the diffusion region is set to 1.2 $\mu$m. As a result, the value of $\lambda_1/2$ becomes 1.2 $\mu$m, which approximately the same as the value of $S_1 + 2S_2$. In this case the width $S_2$ of the diffusion region was about 0.2 $\mu$m, which however was extremely small as compared with the width $S_1$ of the non-diffusion region so that the value of $\lambda_1$ can be regarded as being the same as in the case where the diffusion region does not exist.

Figure 4:
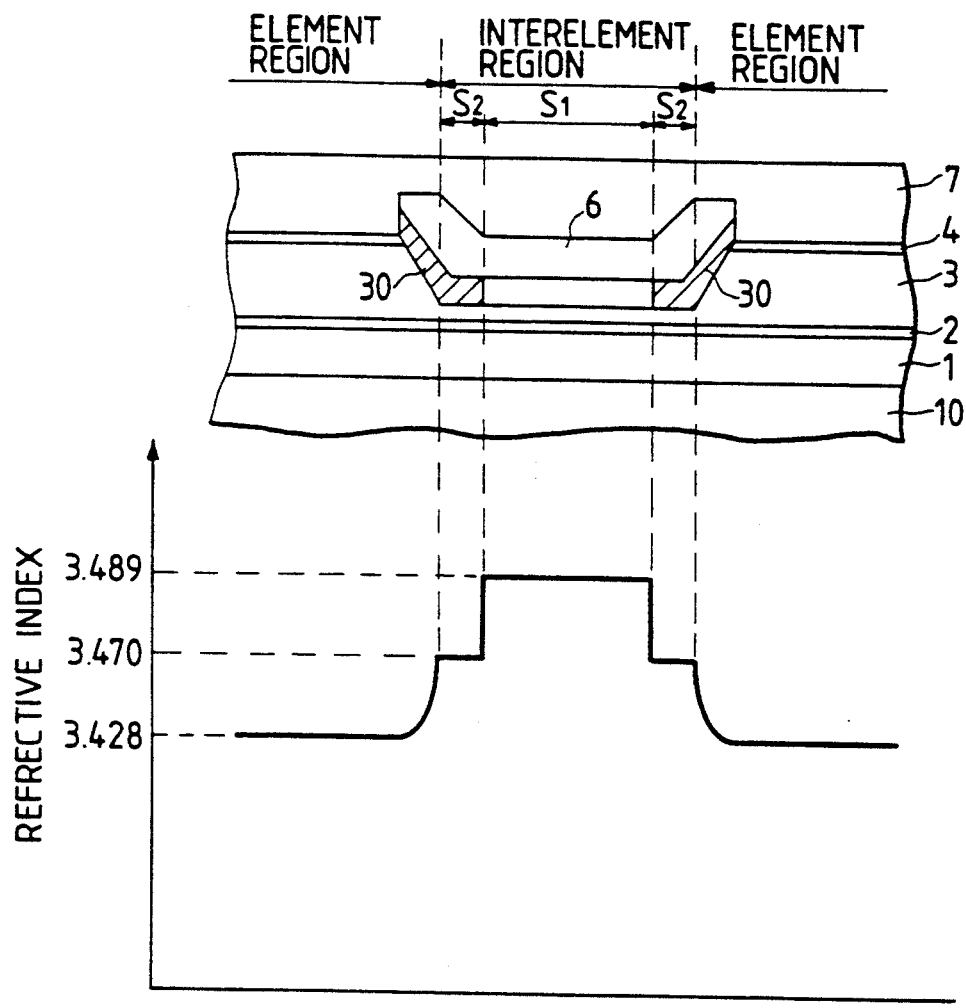
FIG. 4 is an enlarged sectional view of the phase-locked laser array of this invention, whose refractive index is also shown at the bottom portion thereof.
Figure 5A:
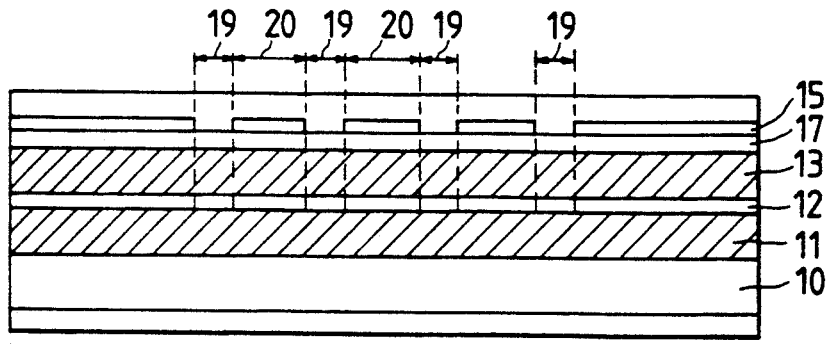
FIG. 5a to FIG. 5c respectively represents the conventional phase-locked laser array.
Figure 5B:
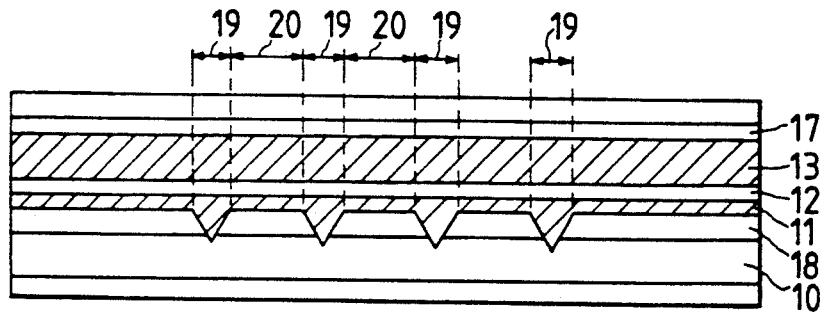
Figure 5C:
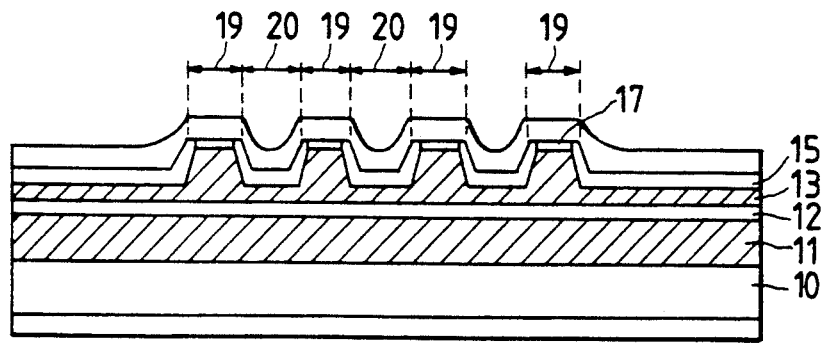
Figure 6A:
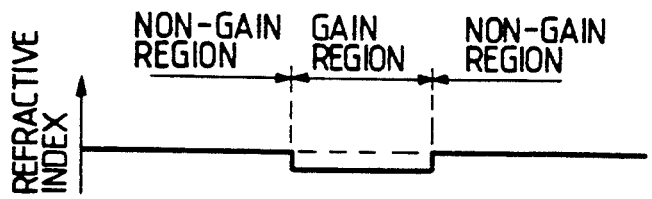
FIG. 6a to FIG. 6d respectively denotes a refractive index distribution diagram of the conventional phase-locked laser array.
Figure 6B:
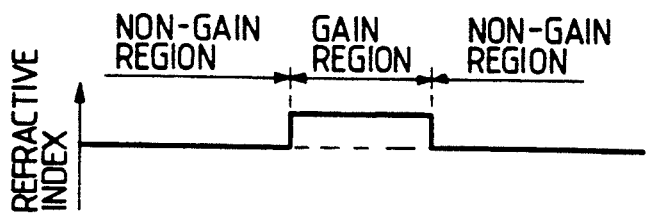
Figure 6C:
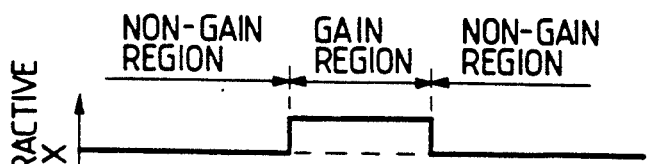
Figure 6D:
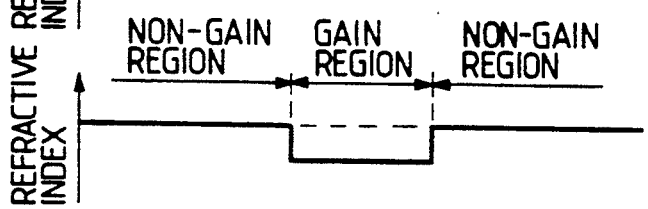
Figure 7A:
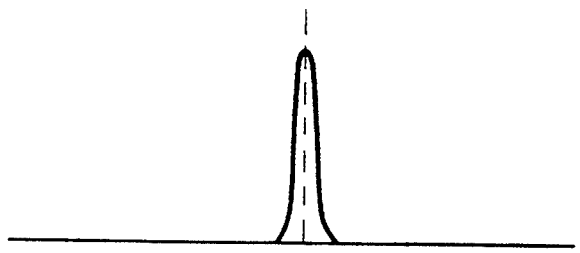
FIG. 7a and FIG. 7b respectively shows a far field pattern.
Figure 7B:
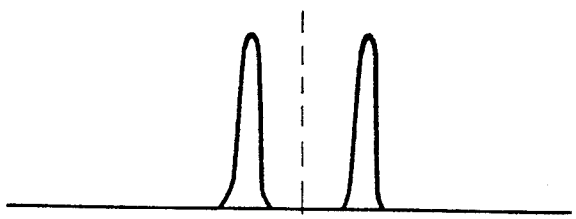

In the phase-locked laser array manufactured in this manner, the effective refractive index in the lateral direction indicates a distribution as shown in FIG. 4 +wherein the refractive index in the inter-element region is higher at the central portion thereof or the non-diffusion region $S_1$, and lower at the both peripheral side portions thereof or the diffusion region $S_2$. In FIG. 4, the same parts as those shown in FIG. 2 are referred by the same reference numerals as indicated in FIG. 2.

In the 0° phase coupled mode having one optical intensity peak in the inter-element region, a strong coupling is generated between the element regions in the same manner as in the case where no diffusion region is existed, thereby obtaining a high gain.

On the other hand, in the 180° phase coupled mode or in the adjacent mode, the light intensity distribution thereof is located at a region adjacent to the inter-element region so that a fairly large extent of the radiation loss therein can not be avoided due to a strong influence of the diffusion region. Accordingly, only the 0 phase coupled mode whose peak of mode is always located at the center of the inter-element region is selected and oscillated. Moreover, since the conditions: $S(S_1 + 2S_2) = \lambda_1/2$ is satisfied as in the case of the conventional device as mentioned hereinbefore, it is possible to realize a stable 0° phase coupled mode without sacrificing the gain of the oscillation mode.

In the above embodiment, AlGaInP was employed as a material for an active layer of the phase locked laser array. However, it is of course possible to employ any other materials which have been employed in the conventional semiconductor laser as an active layer.

It has been confirmed with the phase locked laser array of this invention that the 0° phase coupled mode car, be realized with an electric current of up to eight times as much as that of the threshold value thereof.

We claim:

1. A phase-locked laser array, which comprises:
a compound semiconductor substrate;
a first clad layer;
an active layer;
a second clad layer;
a plurality of element regions for allowing electric current to flow into said active layer; and
inter-element regions formed between said element regions and adapted not to allow electric current to flow therethrough, said inter-element regions comprising a non-diffusion region at a center portion thereof and diffusion regions disposed on both sides of said center portion;
a refractive index in said non-diffusion region being higher than that in said diffusion regions,
wherein said phase-locked laser array is an antiguided type.

2. A phase-locked laser array according to claim 1, wherein each of said second clad layer is being formed into a ridge stripe pattern wherein a plurality of ridge stripes are formed at equal intervals, said ridge stripes constituting said element regions, and spaces between said ridge stripes constituting said inter-element regions.

3. A phase-locked laser array according to claim 2, wherein an optical waveguide layer of superlattice is being deposited on side surfaces of said ridge stripes and on said spaces, and portions of said optical waveguide layer of superlattice deposited on and near to said side surfaces of said ridge stripes are rendered in a disordered state by the diffusion of impurities, thereby forming said diffusion regions on both sides of said inter-element regions, and said non-diffusion region at the center of said inter-element regions.

4. A phase-locked laser array according to claim 3, wherein said optical waveguide layer of superlattice is composed of GaInP well layers with an AlGaInP barrier layer being interposed between said GaInP well layers.

5. A phase-locked laser array according to claim 1, wherein said active layer is composed of an AlGaInP compound.

6. A phase-locked laser array according to claim 1, wherein said compound semiconductor substrate is composed of a GaAs compound.

7. A phase-locked laser array according to claim 1, wherein said second clad layer comprises a ridge stripe pattern including a plurality of ridge stripes constituting said element regions, and spaces being said ridge stripes constituting said inter-element regions.

8. A phase-locked laser array according to claim 7, wherein said plurality of ridge stripes are formed at equal element regions.

9. A phase-locked laser array according to claim 8, wherein said active layer is composed of an AlGaInP compound.

10. A phase-locked laser array according to claim 8, wherein said compound semiconductor substrate is composed of GaAs compound.

11. A phase-locked laser array, comprising:
a compound semiconductor substrate;
a first clad layer;
an active layer;
a second clad layer;
a plurality of element regions for allowing electric current to flow into said active layer;
inter-element regions formed between said element regions and adapted not to allow electric current to flow therethrough, said inter-element regions comprising a non-diffusion region at a center portion thereof and diffusion regions disposed on both sides of said center portion;
a ridge stripe pattern in said second clad layer, said ridge stripe portion including a plurality of ridge stripes and spaces between said ridge stripes; and
a superlattice optical waveguide layer disposed on side surfaces of said ridge stripes and on said spaces between said stripes, a portion of said superlattice optical waveguide layer deposited on and near to said surfaces of said ridge stripes being rendered in a disordered state by impurities diffused therein,
a refractive index in said center portion of said interelement regions being higher than the refractive index at the sides of said center portion,
wherein said phase-locked laser array is an antiguided type.

12. A phase-locked laser array according to claim 11, said plurality of ridge stripes constitute said element regions and said spaces constitute said inter-element regions.

13. A phase-locked laser array according to claim 12, wherein said plurality of ridge stripes are formed at equal element regions.

14. A phase-locked laser array according to claim 13, wherein said active layer is composed of an AlGaInP compound.

15. A phase-locked laser array according to claim 13, wherein said compound semiconductor substrate is composed of GaAs compound.

16. A phase-locked laser array according to claim 11, wherein said superlattice optical waveguide layer comprises a plurality of GaInP well layers with an AlGaInP barrier layer interposed between said GaInP well layers.

17. A phase-locked laser array according to claim 11, wherein said active layer is composed of an AlGaInP compound.

18. A phase-locked laser array according to claim 11, wherein said compound semiconductor substrate is composed of GaAs compound.

* * * * *